US012796222B2

(12) United States Patent
Kim et al.

(10) Patent No.: US 12,796,222 B2
(45) Date of Patent: Nov. 10, 2026

(54) DISPLAY PANEL

(71) Applicant: Samsung Display Co., LTD., Yongin-si (KR)

(72) Inventors: Myeongho Kim, Yongin-si (KR); Youngoo Kim, Yongin-si (KR); Jaybum Kim, Yongin-si (KR); Kyoung Seok Son, Yongin-si (KR); Seunghun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 479 days.

(21) Appl. No.: 18/369,928

(22) Filed: Sep. 19, 2023

(65) Prior Publication Data

US 2024/0224591 A1 Jul. 4, 2024

(30) Foreign Application Priority Data

Dec. 29, 2022 (KR) ........................ 10-2022-0188791

(51) Int. Cl.
*H10K 59/121* (2023.01)
*H10K 59/124* (2023.01)

(52) U.S. Cl.
CPC ..... *H10K 59/1213* (2023.02); *H10K 59/1216* (2023.02); *H10K 59/124* (2023.02)

(58) Field of Classification Search
CPC ......................... H10D 86/60; H10K 59/00–95
See application file for complete search history.

(56) References Cited

U.S. PATENT DOCUMENTS 9,412,876 B2 8/2016 Koezuka et al.
2021/0036029 A1* 2/2021 Park .................... H10D 86/471
2022/0109037 A1* 4/2022 Yuan .................... H10D 86/423
2022/0208923 A1 6/2022 Kim et al.
2022/0302239 A1* 9/2022 Kim .................... H10K 77/111

FOREIGN PATENT DOCUMENTS

JP 2021100121 A 7/2021
KR 1020180079082 A 7/2018
KR 20210122938 A * 10/2021 ........... H10D 86/431
KR 1020210122938 A 10/2021
KR 1020220094259 A 7/2022

* cited by examiner

*Primary Examiner* — Christine S. Kim
*Assistant Examiner* — Andrew Victor Prostor
(74) *Attorney, Agent, or Firm* — CANTOR COLBURN LLP

(57) ABSTRACT

A display panel includes a light-emitting element, and a pixel circuit electrically connected to the light-emitting element. The pixel circuit includes a first transistor including a first semiconductor pattern including a first channel region, and a first gate electrode disposed on the first semiconductor pattern and overlapping the first channel region, a first insulation layer disposed between the first semiconductor pattern and the first gate electrode and overlapping the first channel region, a second insulation layer disposed on the first gate electrode and covering the first transistor, a second transistor disposed on the second insulation layer, and including a second semiconductor pattern including a second channel region, and a second gate electrode disposed on the second semiconductor pattern and overlapping the second channel region, and a third insulation layer disposed between the second semiconductor pattern and the second gate electrode and overlapping the first transistor in a plan view.

18 Claims, 10 Drawing Sheets

DISPLAY PANEL

This application claims priority to Korean Patent Application No. 10-2022-0188791, filed on Dec. 29, 2022, the and all the benefits accruing therefrom under 35 U.S.C. § 119, the content of which in its entirety is herein incorporated by reference.

BACKGROUND

1. Field

The disclosure herein relates to a display panel including a transistor for driving a pixel.

2. Description of the Related Art

Display devices such as televisions, mobile phones, tablets, navigation system units, and game consoles may include a display panel which provides images to a user through a display screen. The display panel may include a light-emitting element for generating light and a pixel circuit for controlling an amount of current flowing to the light-emitting element. The pixel circuit may include transistors organically connected to each other, and the transistors may affect driving reliability of the display panel.

SUMMARY

The disclosure provides a display panel with improved driving reliability by including a transistor with high-speed driving properties.

An embodiment of the inventive concept provides a display panel including a light-emitting element, and a pixel circuit electrically connected to the light-emitting element, wherein the pixel circuit includes a first transistor including a first semiconductor pattern including a first source region, a first drain region, and a first channel region disposed between the first source region and the first drain region, and a first gate electrode disposed on the first semiconductor pattern and overlapping the first channel region, a first insulation layer disposed between the first semiconductor pattern and the first gate electrode and overlapping the first channel region, a second insulation layer disposed on the first gate electrode, and covering the first transistor, a second transistor disposed on the second insulation layer, and including a second semiconductor pattern including a second source region, a second drain region, and a second channel region disposed between the second source region and the second drain region, and a second gate electrode disposed on the second semiconductor pattern and overlapping the second channel region, and a third insulation layer disposed between the second semiconductor pattern and the second gate electrode and overlapping the first transistor in a plan view, wherein the first semiconductor pattern and the second semiconductor pattern each include a metal oxide semiconductor material.

In an embodiment, a charge carrier in the first semiconductor pattern may have a first mobility and a charge carrier in the second semiconductor pattern may have a second mobility, wherein the first mobility may be lower than the second mobility.

In an embodiment, the first transistor and the second transistor may be spaced apart along a first direction, and the third insulation layer may be extended in the first direction.

In an embodiment, the third insulation layer may overlap each of the second source region, the second drain region, and the second channel region.

In an embodiment, the third insulation layer may include a first insulation portion disposed on the second insulation layer, and a second insulation portion disposed on the second semiconductor pattern.

In an embodiment, the third insulation layer may contact a side surface of the second semiconductor pattern.

In an embodiment, the first transistor may be a driving transistor, and the second transistor may be a switching transistor.

In an embodiment, the pixel circuit may further include a fourth insulation layer disposed on the second gate electrode and covering the second transistor.

In an embodiment, a hydrogen content of the fourth insulation layer may be higher than a hydrogen content of the third insulation layer.

In an embodiment, the first insulation layer may overlap each of the first channel region, the first source region, and the first drain region, and the first gate electrode may overlap the first channel region.

In an embodiment, the first transistor may further include a first conductive pattern disposed below the first semiconductor pattern, wherein the pixel circuit may further include a buffer layer disposed on the first conductive pattern.

In an embodiment, the pixel circuit may further include a first capacitor including a first storage electrode and a second storage electrode, wherein the first storage electrode may be disposed in a same layer as a layer on which the first semiconductor pattern is disposed, and the second storage electrode may be disposed in a same layer as a layer on which the first gate electrode is disposed.

In an embodiment, the first insulation layer may be disposed between the first storage electrode and the second storage electrode.

In an embodiment, the pixel circuit may further include a second capacitor including a first hold electrode and a second hold electrode, wherein the first hold electrode may be disposed in a same layer as a layer on which the first conductive pattern is disposed, and the second hold electrode may be disposed in a same layer as a layer on which the first semiconductor pattern is disposed.

In an embodiment, the buffer layer may be disposed between the first hold electrode and the second hold electrode.

In an embodiment, the second transistor may further include a metal oxide pattern disposed below the second semiconductor pattern, wherein the metal oxide pattern may include a first pattern portion overlapping the second source region and a second pattern portion overlapping the second drain region.

In an embodiment, the metal oxide pattern may not overlap the second channel region.

In an embodiment, the first pattern portion and the second pattern portion may be spaced apart in the plan view, and the first insulation layer may be disposed between the first pattern portion and the second pattern portion.

In an embodiment, the metal oxide pattern may be disposed in a same layer as a layer on which the first semiconductor pattern is disposed, and a material included in the metal oxide pattern may be identical to the material included in the first semiconductor pattern.

In an embodiment of the inventive concept, a display panel includes a light-emitting element, and a pixel circuit electrically connected to the light-emitting element, wherein the pixel circuit includes a metal oxide transistor including a metal oxide semiconductor pattern including a source region, a drain region, and a channel region disposed between the source region and the drain region, and a gate electrode disposed on the metal oxide semiconductor pattern and overlapping the channel region, a gate insulation portion disposed between the metal oxide semiconductor pattern and the gate electrode so as to overlap the source region, the drain region, and the channel region, and in contact with a side surface of the metal oxide semiconductor pattern, a metal oxide pattern disposed below the metal oxide semiconductor pattern, and including a first pattern portion overlapping the source region and a second pattern portion overlapping the drain region, and an upper insulation portion disposed on the gate insulation portion and the gate electrode, wherein a hydrogen content of the gate insulation portion is lower than a hydrogen content of the upper insulation portion.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
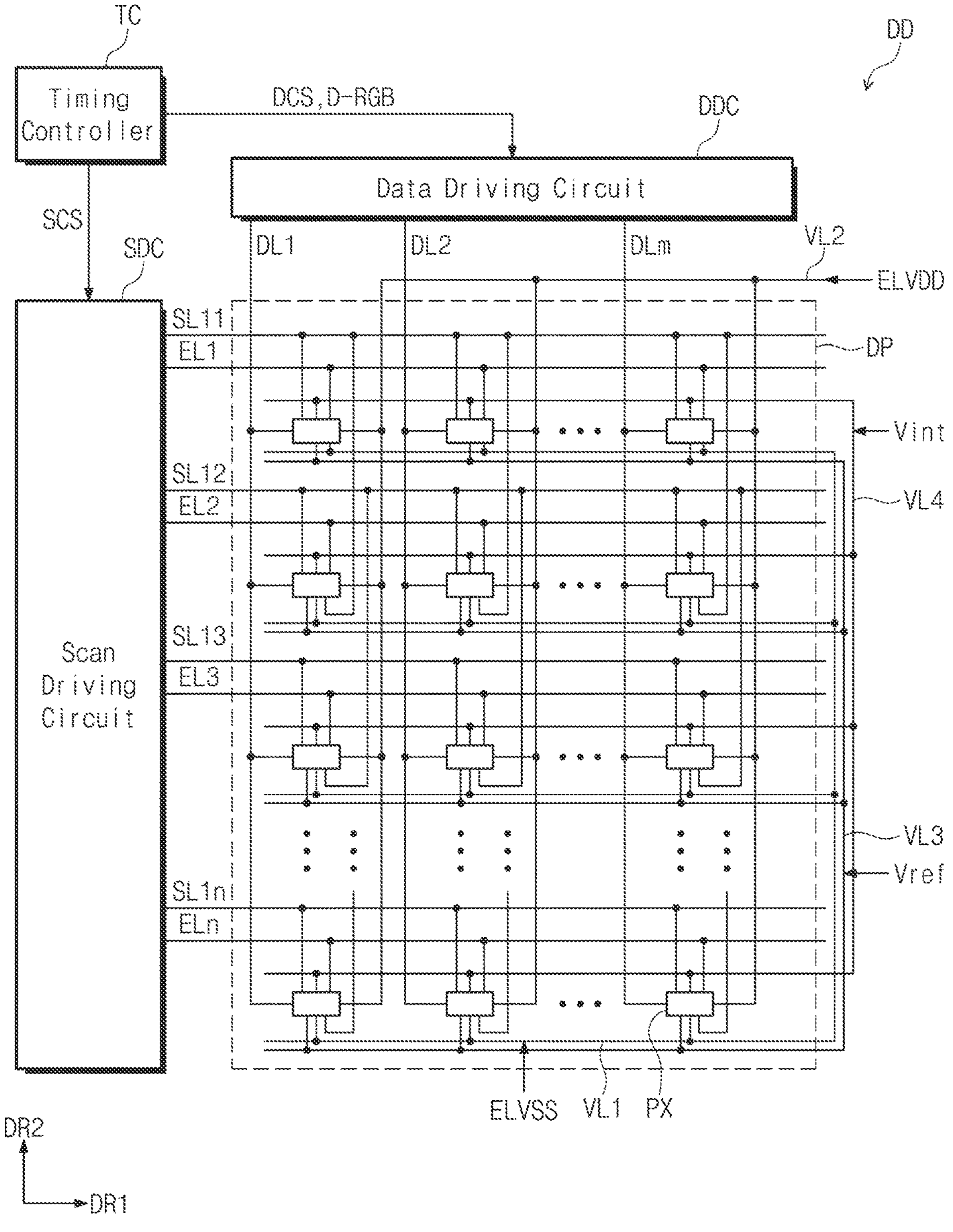
FIG. 1 is a block diagram of an embodiment of a display device according to the inventive concept.

The inventive concept may be modified in many alternate forms, and thus illustrative embodiments will be exemplified in the drawings and described in detail. It should be understood, however, that it is not intended to limit the inventive concept to the particular forms disclosed, but rather, is intended to cover all modifications, equivalents, and alternatives falling within the spirit and scope of the inventive concept.

In the disclosure, when an element (or a region, a layer, a portion, etc.) is also referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The term "and/or" includes any and all combinations of one or more of which associated elements may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of the elements shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

Hereinafter, a display panel in an embodiment of the inventive concept will be described with reference to the accompanying drawings.

FIG. 1 is a block diagram of an embodiment of a display device DD according to the inventive concept.

The display device DD may be a device which is activated according to an electrical signal, and which displays images. In an embodiment, the display device DD may be a large-sized device such as a television and an external billboard, and may also be a small-and-medium-sized device such as a monitor, a mobile phone, a tablet, a navigation system unit, and a game console, for example. The embodiments of the display device DD are some of embodiments, and the display device DD is not limited to any one thereof without departing from the inventive concept.

Referring to FIG. 1, the display device DD includes a timing controller TC, a scan driving circuit SDC, a data driving circuit DDC, and a display panel DP. The timing controller TC and the data driving circuit DDC may each be provided in the form of a driving chip, but not limited thereto, and may be directly formed in the display panel DP.

The timing controller TC may receive an image input signal and generate an image data signal D-RGB obtained by converting the data format of the image input signal to meet interface specifications with the data driving circuit DDC. The timing controller TC may receive a control signal and output a scan control signal SCS and a data control signal DCS. The image input signal and the control signal may be provided from a main controller (or a graphic processor).

The data driving circuit DDC may receive the data control signal DCS and the image data signal D-RGB from the timing controller TC. The data driving circuit DDC converts an image data signal D-RGB into data signals, and may output the data signals to a plurality of data lines DLI to DLm. Here, m is a natural number. The data signals may be analog voltages corresponding to gray scale values of the image data signal D-RGB.

The scan driving circuit SDC may receive the scan control signal SCS from the timing controller TC. The scan control signal SCS may include a vertical start signal which starts the operation of the scan driving circuit SDC, a clock signal which determines the output timing of signals, or the like. The scan driving circuit SDC generates a plurality of scan signals, and may sequentially output the scan signals to corresponding scan signal lines SL11 to SL1$n$. Here, n is a natural number. Also, the scan driving circuit SDC generates a plurality of light emission control signals in response to the scan control signal SCS, and may output the plurality of light emission control signals to corresponding emission signal lines EL1 to ELn.

In FIG. 1, the scan signals and the light emission control signals are illustrated as being output from one scan driving circuit SDC, but the embodiment of the is not limited thereto. In the display device DD in an embodiment, a driving circuit for generating and outputting scan signals and a driving circuit for generating and outputting light emission control signals may be separately formed.

The display panel DP in an embodiment of the inventive concept may be a light-emitting type display panel, but is not particularly limited thereto. In an embodiment, the display panel DP may be an organic light-emitting display panel, an inorganic light-emitting display panel, or a quantum-dot light-emitting display panel. A light-emitting layer of the organic light-emitting display panel may include an organic light-emitting material, and a light-emitting layer of the inorganic light-emitting display panel may include an inorganic light-emitting material. A light-emitting layer of the quantum-dot light-emitting display panel may include a quantum dot, a quantum load, or the like. Hereinafter, the display panel DP will be described as an organic light-emitting display panel.

The display panel DP may include a plurality of groups of scan lines. FIG. 1 illustrates scan signal lines SL11 to SL1$n$ of a first group. The display panel DP may include light emission signal lines EL1 to ELn, data lines DLI to DLm, a first voltage line VL1, a second voltage line VL2, a third voltage line VL3, a fourth voltage line VL4, and pixels PX.

The scan signal lines SL11 to SL1$n$ of the first group may be extended in a first direction DR1 and arranged in a second direction DR2. The light emission signal lines EL1 to ELn may be extended in the first direction DR1 arranged in the second direction DR2. The data lines DLI to DLm may intersect the scan signal lines SL11 to SL1$n$ of the first group. The data lines DLI to DLm may be extended in the second direction DR2 and may be arranged in the first direction DR1.

Each of the pixels PX is electrically connected to the scan signal lines SL11 to SL1$n$ of the first group, the light emission signal lines EL1 to ELn, and the data lines DLI to DLm. However, this is only one of embodiments, and the type and number of signal lines connected to the pixels PX are not limited thereto, and the electrical connection relationship of the signal lines may also be changed.

The first voltage line VL1 may receive a first power voltage ELVSS. The second voltage line VL2 may receive a second power voltage ELVDD. The second power voltage ELVDD may have higher level than the first power voltage ELVSS. The third voltage line VL3 may receive a reference voltage Vref (hereinafter, a first voltage). The fourth voltage line VL4 may receive an initialization voltage Vint (hereinafter, a second voltage). Each of the first voltage Vref and the second voltage Vint may have a lower level than the second power voltage ELVDD. In the illustrated embodiment, the second voltage Vint may have a lower level than the first voltage Vref and the first power voltage ELVSS.

Figure 2:
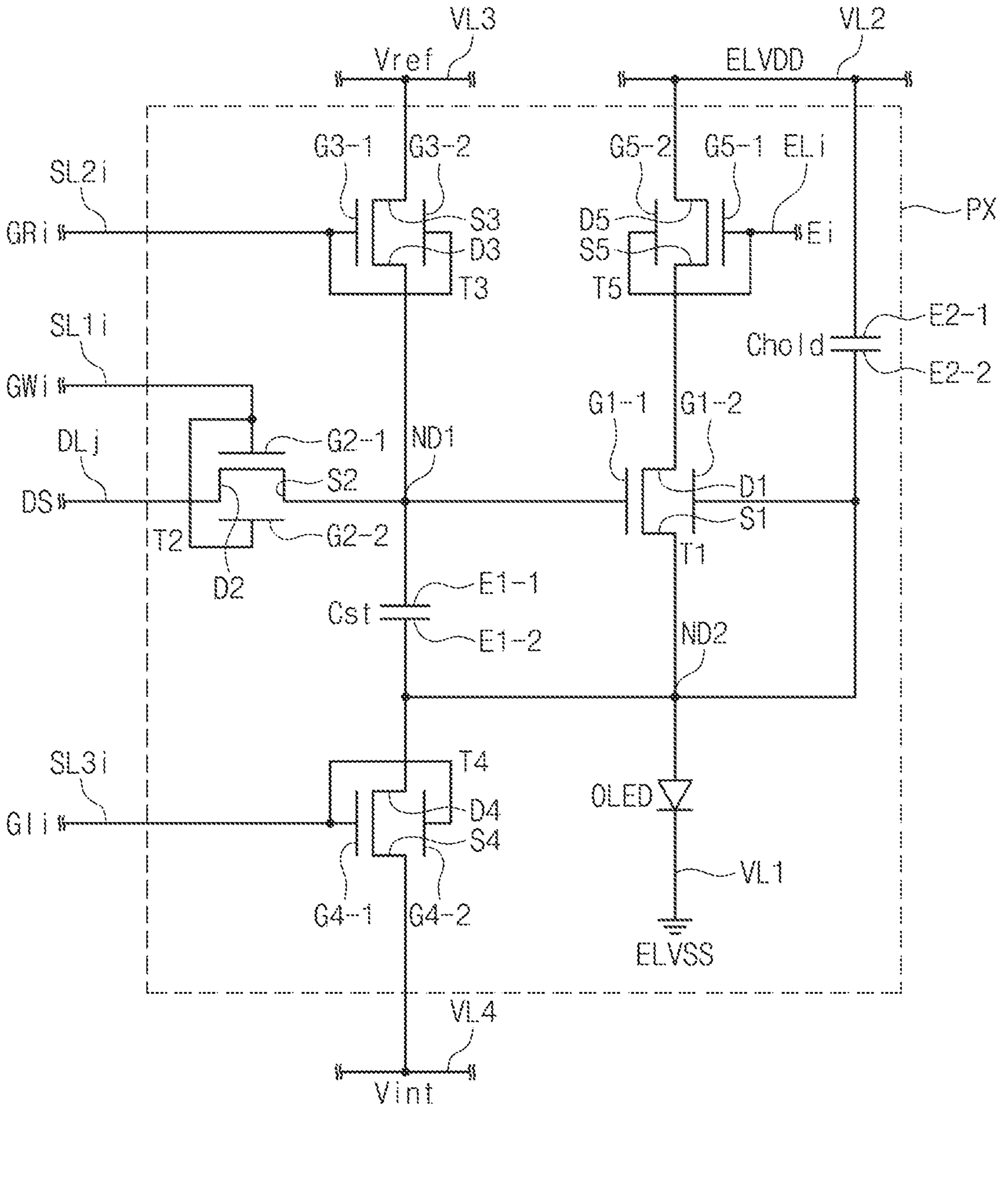
FIG. 2 is an equivalent circuit diagram of an embodiment of a pixel according to the inventive concept.

Each of the pixels PX constituting the display panel DP may include a light-emitting element OLED (refer to FIG. 2) and a pixel circuit for controlling the emission of the light-emitting element OLED (refer to FIG. 2). The pixel circuit may include a plurality of transistors and at least one capacitor. At least one of the scan driving circuit SDC or the data driving circuit DDC may include transistors formed through the same process as the process through which the pixel circuit of the pixels PX is formed.

The pixels PX may be provided with data voltages in response to scan signals. The pixels PX may display an image by emitting light of luminance corresponding to the data voltages in response to light emission signals. The light emission duration of the pixels PX may be controlled by the light emission signals. As a result, the display panel DP may output an image through the pixels PX.

The pixels PX may include a plurality of groups which generate light of different colors from each other. In an embodiment, the pixels PX may include red pixels for generating red light, green pixels for generating green light, and blue pixels for generating blue light, for example. Light-emitting layers of a light-emitting element of a red pixel, a light-emitting element of a green pixel, and a light-emitting element of a blue pixel may include or consist of different materials, respectively. However, the embodiment of the inventive concept is not necessarily limited thereto.

FIG. 2 is an equivalent circuit diagram of an embodiment of the pixel PX according to the inventive concept.

FIG. 2 representatively illustrates a pixel PX connected to an i-th scan signal line SL1$i$ (or a first scan line) among the first group of the scan signal lines SL11 to SL1$n$ (refer to FIG. 1), and connected to a j-th data line DLj (or a first data line) among the data lines DLI to DLm (refer to FIG. 1). The pixel PX of an embodiment illustrated in FIG. 2 may be connected to an i-th scan line SL2$i$ (or a second scan line) among scan lines of a second group, and an i-th scan line SL3$i$ (or a third scan line) among scan lines of a third group. Here, i and j represent natural numbers equal to or less than n and m, respectively.

In the illustrated embodiment, the pixel circuit may include first to fifth transistors T1 to T5, a storage capacitor $C_{ST}$ (or a first capacitor), a hold capacitor $C_{HOLD}$ (or a second capacitor), and a light-emitting element OLED. The first to fifth transistors T1 to T5 may each be a transistor including an oxide semiconductor layer. In the illustrated embodiment, the first to fifth transistors T1 to T5 are described as N-type transistors, but are not limited thereto, and at least one of the first to fifth transistors T1 to T5 may be a P-type transistor. Also, in an embodiment of the inventive concept, at least one of the first to fifth transistors T1 to T5 may be omitted, or an additional transistor may be further included in the pixel PX.

The first to fifth transistors T1 to T5 may each include a source, a drain, and a gate. The source, the drain, and the gate may be provided as a source electrode, a drain electrode, and a gate electrode, respectively. In the disclosure, "being electrically connected between a transistor and a signal line or between a transistor and a transistor" means that "an electrode of the transistor has a shape of a single body with the signal line, or is connected through a connection electrode."

In the illustrated embodiment, each of the first to fifth transistors T1 to T5 is illustrated as including two gates, but at least one of the transistors may include only one gate. Upper gates G2-1, G3-1, G4-1, and G5-1 and lower gates G2-2, G3-2, G4-2, and G5-2 of respective second to fifth transistors T2 to T5 are illustrated as being electrically connected to each other, but the embodiment of the inventive concept is not limited thereto. The lower gates G2-2, G3-2, G4-2, and G5-2 of the respective second to fifth transistors T2 to T5 may be floated electrodes.

In the illustrated embodiment, the light-emitting element OLED may be a light-emitting diode. The light-emitting element OLED may include a first electrode, a second electrode, and a light-emitting layer disposed between the first electrode and the second electrode. The first electrode of the light-emitting element OLED may be electrically connected to a second node ND2 connected to the first transistor T1, and the second electrode may be electrically connected to the first voltage line VL1 receiving the first power voltage ELVSS.

The first transistor T1 may be electrically connected between the second voltage line VL2 receiving the second power voltage ELVDD and the light-emitting element OLED. The first transistor T1 may include a first source region S1 electrically connected to the second node ND2, a first drain region D1 electrically connected to the second voltage line VL2 through the fifth transistor T5, and a first upper gate G1-1 electrically connected to a first node ND1. The first transistor T1 may further include a first lower gate G1-2 electrically connected to the second node ND2. The first transistor T1 may control a driving current of the light-emitting element OLED according to a charging capacity of the storage capacitor $C_{ST}$. In the illustrated embodiment, the first transistor T1 may be defined as a driving transistor.

The second transistor T2 may be electrically connected between the data line DLj and the first node ND1. The second transistor T2 may include a second source S2 electrically connected to the first node ND1, a second drain region D2 electrically connected to the data line DLj, and a second upper gate G2-1 electrically connected to the first scan line SL1*i* receiving a first scan signal GWi. The second transistor T2 may further include a second lower gate G2-2 electrically connected the second upper gate G2-1. The second transistor T2 may be turned on according to the first scan signal GWi and provide a data voltage to the storage capacitor $C_{ST}$ according to a data signal DS transmitted from the data line DLj.

The third transistor T3 may be electrically connected between the first node ND1 and the third voltage line VL3 receiving the first voltage Vref. The third transistor T3 may include a third drain region D3 electrically connected to the first node ND1, a third source S3 electrically connected to the third voltage line VL3, and a third upper gate G3-1 electrically connected to the second scan line SL2*i* receiving a second scan signal GRi. The third transistor T3 may further include a third lower gate G3-2 electrically connected the third upper gate G3-1. The third transistor T3 may be turned on according to the second scan signal GRi to initialize the first node ND1 to the first voltage Vref.

The fourth transistor T4 may be electrically connected between the fourth voltage line VL4 receiving the second voltage Vint and the second node ND2. The fourth transistor T4 may include a fourth drain region D4 electrically connected to the second node ND2, a fourth source S4 electrically connected to the fourth voltage line VL4, and a fourth upper gate G4-1 electrically connected to the third scan line SL3*i* receiving a third scan signal GIi. The fourth transistor T4 may further include a fourth lower gate G4-2 electrically connected the fourth upper gate G4-1. The fourth transistor T4 may be turned on according to the third scan signal GIi to initialize the second node ND2 to the second voltage Vint.

The fifth transistor T5 may be electrically connected between the second voltage line VL2 and the first transistor T1. The fifth transistor T5 may include a fifth drain region D5 electrically connected to the second voltage line VL2, a fifth source S5 electrically connected to the first drain region D1, and a fifth upper gate G5-1 electrically connected to a light emission line ELi receiving a light emission signal Ei. The fifth transistor T5 may further include a fifth lower gate G5-2 electrically connected the fifth upper gate G5-1. The fifth transistor T5 is turned on according to the light emission signal Ei, and the first transistor T1 may provide a current corresponding to a voltage value stored in the storage capacitor $C_{ST}$ to the light-emitting element OLED. The light-emitting element OLED may emit light to a luminance corresponding to the data signal DS. In the illustrated embodiment, the second, third, fourth and fifth transistors T2, T3, T4, and T5 may be defined as switching transistors.

The charge carrier mobility in the first transistor T1 may be lower than the charge carrier mobility in the second, third, fourth and fifth transistors T2, T3, T4, and T5. In an embodiment, the mobility of electrons in the first transistor T1 may be lower than the mobility of electrons in the second, third, fourth and fifth transistors T2, T3, T4, and T5. In an embodiment, when a charge carrier in the first transistor T1 has a first mobility and a charge carrier in the second transistor T2 has a second mobility, the first mobility may be lower than the second mobility, for example. The driving transistor T1 performs a function of controlling the amount of current, while the switching transistors T2, T3, T4, and T5 are desired to be quickly turned on and off for high-speed driving, so that the first mobility may be lower than the second mobility.

The storage capacitor $C_{ST}$ may be electrically connected between the first node ND1 and the second node ND2. The storage capacitor $C_{ST}$ may include a first electrode E1-1 electrically connected to the first node ND1 and a second electrode E1-2 electrically connected to the second node ND2. In the disclosure, the first electrode E1-1 electrically connected to the first node ND1 may mean a first storage electrode E1-1, and the second electrode E1-2 electrically connected to the second node ND2 may mean a second storage electrode E1-2.

The hold capacitor $C_{HOLD}$ may be electrically connected between the second voltage line VL2 and the second node ND2. The hold capacitor $C_{HOLD}$ may include a first electrode E2-1 electrically connected to the second voltage line VL2 and a second electrode E2-2 electrically connected to the second node ND2. In the disclosure, the first electrode E2-1 electrically connected to the second voltage line VL2 may mean a first hold electrode E2-1, and the second electrode E2-2 electrically connected to the second node ND2 may mean a second hold electrode E2-2.

Each of the of pixels PX illustrated in FIG. 1 may include a pixel circuit having the same configuration shown in the equivalent circuit diagram of the pixel PX illustrated in FIG. 2. However, the configuration of the pixel PX illustrated in FIG. 2 is only one of embodiments, and the number or connection structure of transistors and capacitors included in the pixel PX may be variously changed.

Figure 3A:
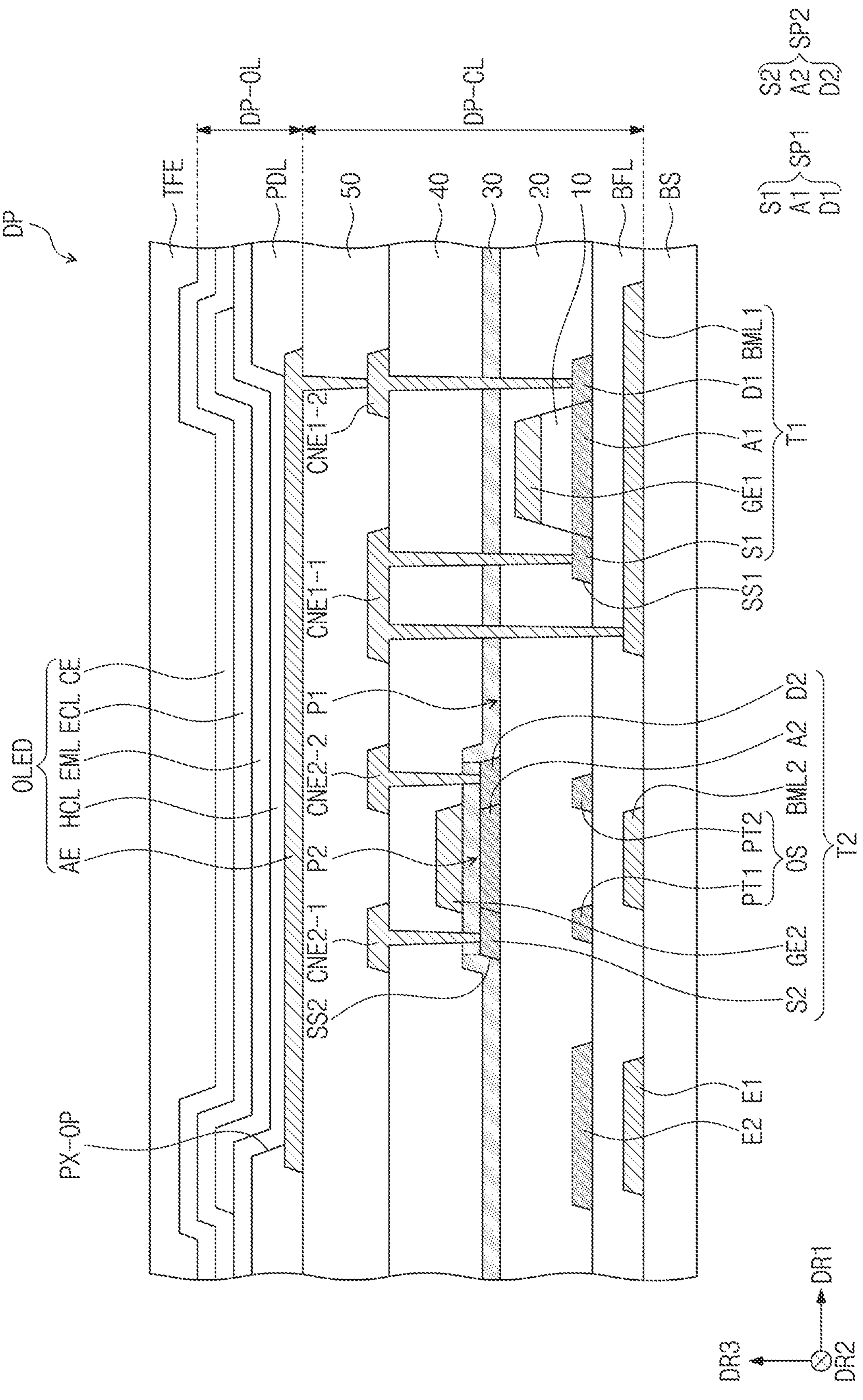
FIG. 3A to FIG. 3C are cross-sectional views of an embodiment of a display panel according to the inventive concept.
Figure 3B:
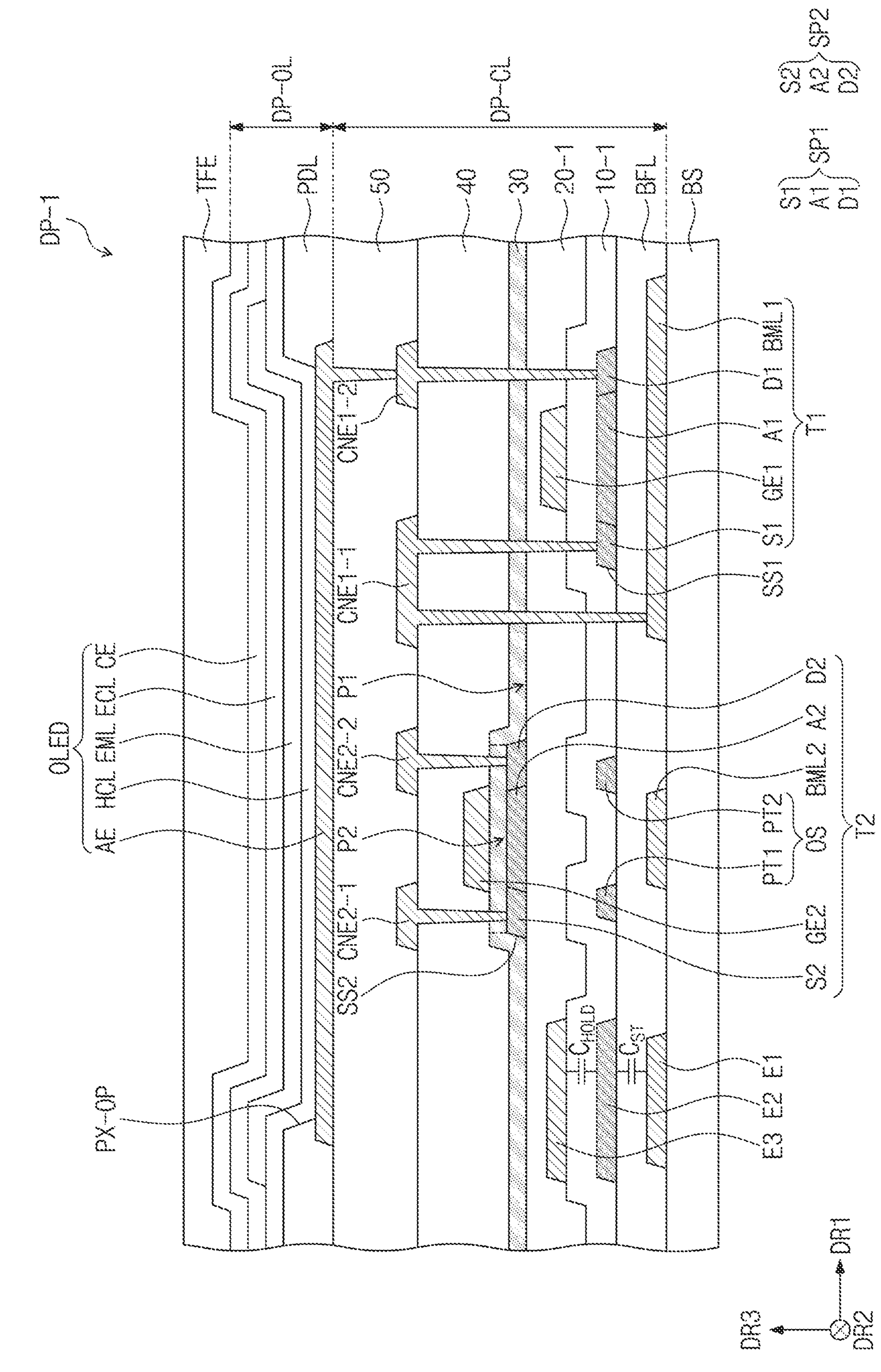
Figure 3C:
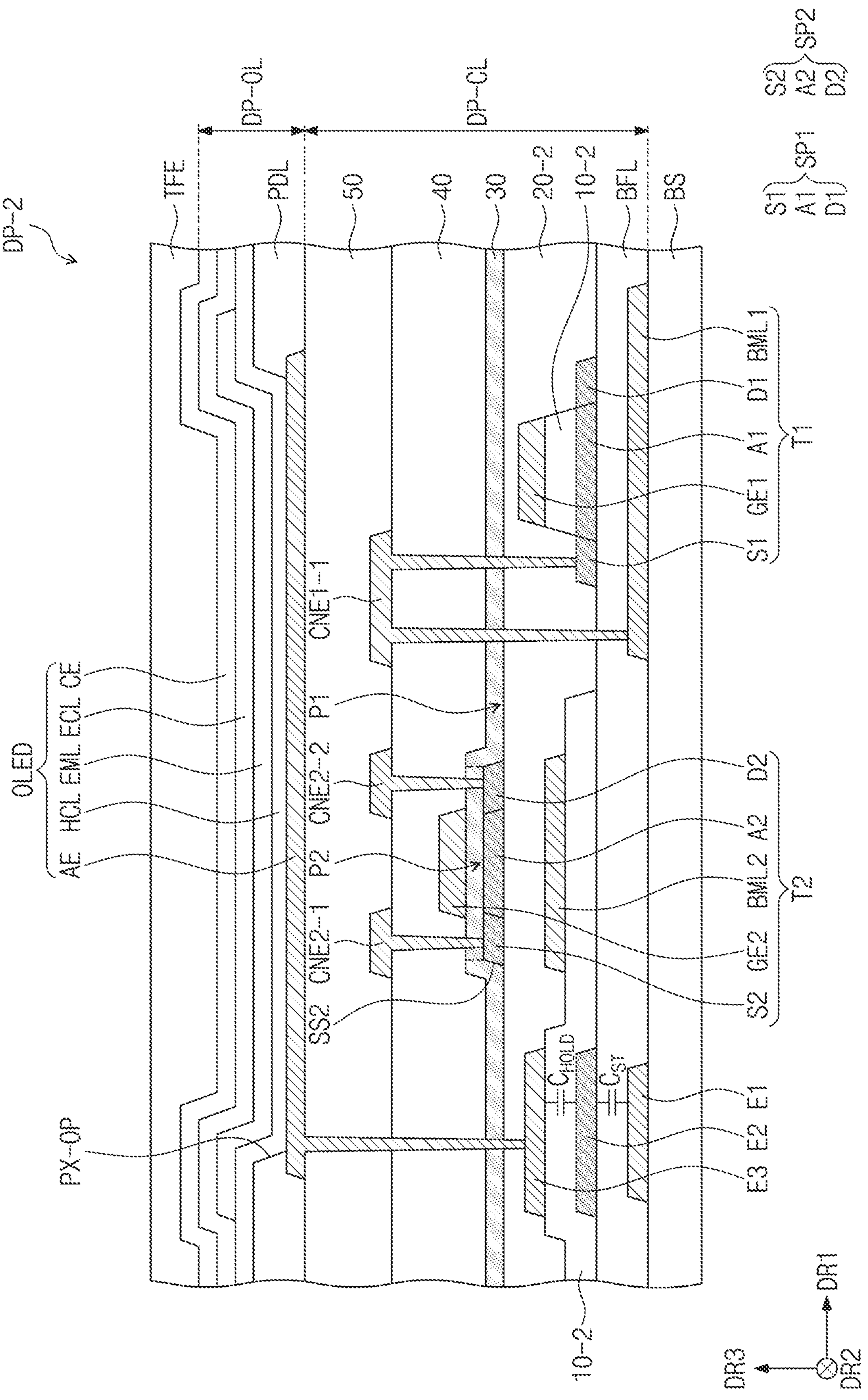

FIG. 3A is a cross-sectional view of an embodiment of the display panel DP according to the inventive concept. FIG. 3B and FIG. 3C are cross-sectional views of another embodiment of display panels DP-1 and DP-2 according to the inventive concept.

Referring to FIG. 3A, the display panel DP may include a base layer BS, a circuit element layer DP-CL, a display element layer DP-OL, and an encapsulation layer TFE. Although not illustrated, the display panel DP of an embodiment may further include a functional layer such as an anti-reflection layer or a refractive index control layer disposed on the encapsulation layer TFE.

In an embodiment, each of the pixels PX (refer to FIG. 2) of the display panel DP may include transistors disposed on the circuit element layer DP-CL and a light-emitting element OLED disposed on the display element layer DP-OL to be connected to the transistors, for example. FIG. 3A to FIG. 3C illustrate cross-sections of the first transistor T1, the second transistor T2, and the light-emitting element OLED among the transistors constituting the pixel PX (refer to FIG. 2).

The base layer BS may provide a base surface on which the circuit element layer DP-CL is disposed. The base layer BS may include a glass substrate, a metal substrate, a polymer substrate, or an organic/inorganic composite material substrate.

In an embodiment, the base layer BS may include at least one synthetic resin layer. The synthetic resin layer included in the base layer BS may include at least one of an acrylic resin, a methacrylic resin, polyisoprene, a vinyl-based resin, an epoxy-based resin, a urethane-based resin, a cellulose-based resin, a siloxane-based resin, a polyamide-based resin, or a perylene-based resin.

The base layer BS may further include a barrier layer defining an upper surface of the base layer BS. The barrier layer may include at least one inorganic layer for preventing foreign substances from entering from the outside. In an embodiment, the barrier layer may include at least one of aluminum oxide, titanium oxide, silicon oxide, silicon nitride, silicon oxynitride, zirconium oxide, or hafnium oxide, for example.

The circuit element layer DP-CL may be disposed on the base layer BS. The circuit element layer DP-CL may include the transistors T1 and T2 constituting the pixel circuit of the pixel PX (refer to FIG. 2), and a plurality of insulation layers BFL, 10, 20, 30, 40, and 50. The plurality of insulation layers BFL, 10, 20, 30, 40, and 50 may include a buffer layer BFL and first to fifth insulation layers 10, 20, 30, 40, and 50. However, the number and the stacking structure of insulation layers included in the circuit element layer DP-CL are not limited to the illustrated embodiment.

Through coating or deposition, an insulation layer, a semiconductor layer, and a conductive layer are formed on the base layer BS, and then the insulation layer, the semiconductor layer, and the conductive layer are patterned through a plurality of times of photolithography to form a semiconductor pattern and a conductive pattern of the circuit element layer DP-CL. Cross-sectional structures of the circuit element layer DP-CL illustrated in FIG. 3A to 3C are only one of embodiments, and may vary depending on a manufacturing process of the circuit element layer DP-CL or a configuration of the pixel circuit.

The first transistor T1 includes a first semiconductor pattern SP1, and a first gate electrode GE1. The first semiconductor pattern SP1 includes a first source region S1, a first channel region A1, and a first drain region D1. The first transistor T1 may include a first conductive pattern BML1 disposed in a lower portion of the first semiconductor pattern SP1.

The second transistor T2 may include a second semiconductor pattern SP2 and a second gate electrode GE2. The second semiconductor pattern SP2 includes a second source region S2, a second channel region A2, and a second drain region D2. The second transistor T2 may include a second conductive pattern BML2 disposed in a lower portion of the second semiconductor pattern SP2. In an embodiment, the second transistor T2 may be spaced from the first transistor T1 along the first direction DR1. In the disclosure, the second transistor T2 may mean a "metal oxide transistor" and the second semiconductor pattern SP2 may mean a metal oxide semiconductor pattern.

The buffer layer BFL may be disposed on the base layer BS. The buffer layer BFL may cover the first conductive pattern BML1. The buffer layer BFL may improve a coupling force between the base layer BS and the first semiconductor pattern SP1 and/or the first conductive pattern BML1. In an embodiment, the buffer layer BFL may include at least one inorganic layer, for example, and may include at least one of aluminum oxide, titanium oxide, silicon oxide, silicon nitride, silicon oxynitride, zirconium oxide, or hafnium oxide, for example.

On the buffer layer BFL, the first semiconductor pattern SP1 may be disposed. In an embodiment, the first semiconductor pattern SP1 may include a metal oxide semiconductor material. As the first semiconductor pattern SP1 includes the metal oxide semiconductor material, the electron mobility in a transistor increases, and leak currents may be reduced.

The metal oxide semiconductor material may be a crystalline or amorphous oxide. In an embodiment, the first semiconductor patterns SP1 may include a metal oxide of such as zinc (Zn), indium (In), gallium (Ga), tin (Sn), and titanium (Ti), or a combination of a metal such as zinc (Zn), indium (In), gallium (Ga), tin (Sn), and titanium (Ti) and an oxide thereof, for example. In an embodiment, the metal oxide semiconductor material may include an indium-tin oxide ("ITO"), an indium-gallium-zinc oxide ("IGZO"), a zinc oxide (ZnO), an indium-zinc oxide (IZnO), a zinc-indium oxide ("ZIO"), an indium oxide (InO), a titanium oxide (TiO), an indium-zinc-tin oxide ("IZTO"), a zinc-tin oxide ("ZTO"), or the like.

The first semiconductor pattern SP1 may include a plurality of regions having different electrical properties. In an embodiment, the first semiconductor patterns SP1 may include a plurality of regions distinguished according to whether a metal oxide has been reduced, for example. A region in which the metal oxide has been reduced (hereinafter, a reduction region) has greater conductivity than a region in which the metal oxide has not been reduced (hereinafter, a non-reduction region). The reduction region may substantially serve as a source region (e.g., first source regions S1), a drain region (e.g., the first drain region D1), or a signal transmission region of a transistor. The non-reduction region may substantially correspond to a channel region (e.g., the first channel region A1) of the transistor.

The first source region S1 or the first drain region D1 of the first transistor T1 may itself be the source or drain of the transistors described with reference to FIG. 2. In an alternative embodiment, the source or drain of the first transistor T1 may include the first source region S1 or the first drain region D1 of the first semiconductor pattern SP1 and a conductive electrode connected thereto.

The first source region S1 and the first drain region D1 may be spaced apart with the first channel region A1 interposed therebetween. That is, the first source region S1 and the first drain region D1 may be extended in opposite directions from the first channel region A1.

The first conductive pattern BML1 may be disposed below the first channel region A1 of the first transistor T1. The first conductive pattern BML1 may have a function of a blocking pattern. The first conductive pattern BML1 may be spaced apart from the first channel region A1 with the buffer layer BFL interposed therebetween in a thickness direction. The first conductive pattern BML1 may block light incident toward the first semiconductor pattern SP1 from the outside. Thus, the first conductive pattern BML1 may prevent external light from changing voltage-current properties of the first transistor T1.

The first conductive pattern BML1 overlapping the first channel region A1 may correspond to the first lower gate G1-2 (refer to FIG. 2). The first gate electrode GE1 overlapping the first channel region A1 may correspond to the first upper gate G1-1 (refer to FIG. 2).

The first insulation layer 10 is disposed between the first semiconductor pattern SP1 and the first gate electrode GE1. The first insulation layer 10 may be disposed on the first semiconductor pattern SP1 to overlap the first channel region A1 of the first semiconductor pattern SP1. In an embodiment, the first insulation layer 10 may not overlap the first source region S1 and the first drain region D1 of the first semiconductor pattern SP1. The first insulation layer 10 may be formed by being patterned after being formed through a process of forming one insulation layer.

The first insulation layer 10 may include at least one inorganic layer. In an embodiment, the first insulation layer 10 may include at least one of aluminum oxide, titanium oxide, silicon oxide, silicon nitride, silicon oxynitride, zirconium oxide, or hafnium oxide, for example. However, the material of the first insulation layer 10 is not limited thereto.

The first Gate electrode GE1 may be disposed on the first semiconductor pattern SP1. The first gate electrode GE1 may be disposed in an upper portion of the first channel region A1, and may overlap the first channel region A1. The first insulation layer 10 may be disposed between the first gate electrode GE1 and the first channel region A1. That is, the first gate electrode GE1 may be spaced apart from the first channel region A1 with the first insulation layer 10 interposed therebetween in a thickness direction. The first gate electrode GE may define the first channel region A1 of the first transistor T1. That is, the length of the first channel region A1 of the first transistor T1 may substantially be determined to correspond to the length of the first gate electrode GE1.

The second insulation layer 20 may be disposed on the buffer layer BFL while covering the first semiconductor pattern SP1, and the first gate electrode GE1. The second insulation layer 20 may cover the first source region S1 and the first drain region D1 of the first transistor T1. The first channel region A1 may be spaced from the second insulation layer 20 with the first insulation layer 10 and the first gate electrode GE1 interposed therebetween.

On the second insulation layer 20, the second semiconductor pattern SP2 may be disposed. For high-speed driving of the second transistor T2 relative to the first transistor T1, the second insulation layer 20 may be a layer having different physical or chemical properties compared to the buffer layer BFL.

In an embodiment, the second semiconductor pattern SP2 may not overlap the first semiconductor pattern SP1 in a plan view. The second semiconductor pattern SP2 includes a metal oxide semiconductor material. As the second semiconductor pattern SP2 includes the metal oxide semiconductor material, the electron mobility in a transistor increases, and leak currents may be reduced. The metal oxide semiconductor material may be a crystalline or amorphous oxide. In an embodiment, the second semiconductor pattern SP2 may include the aforementioned indium-tin oxide ("ITO"), indium-gallium-zinc oxide ("IGZO"), zinc oxide (ZnO), indium-zinc oxide (IZnO), zinc-indium oxide ("ZIO"), indium oxide (InO), titanium oxide (TiO), indium-zinc-tin oxide ("IZTO"), zinc-tin oxide ("ZTO"), or the like, for example.

The second semiconductor pattern SP2 may include a plurality of regions having different electrical properties. In an embodiment, the second semiconductor pattern SP2 may include a plurality of regions distinguished according to whether a metal oxide has been reduced. The reduction region of the second semiconductor pattern SP2 may have a relatively large conductivity compared to the non-reduction region. The reduction region of the second semiconductor pattern SP2 may substantially serve as the second source region S2, the second drain region D2, or a signal transmission region. The non-reduction region of the second semiconductor pattern SP2 may substantially correspond to the second channel region A2.

The second source region S2 or the second drain region D2 of the second transistor T2 may itself be the source or drain of the transistors described with reference to FIG. 2. In an alternative embodiment, the source or drain of the second transistor T2 may include the second source region S2 or the second drain region D2 of the second semiconductor pattern SP2 and a conductive electrode connected thereto. The second source region S2 and the second drain region D2 may be spaced apart with the second channel region A2 interposed therebetween. That is, the second source region S2 and the second drain region D2 may be extended in opposite directions from the second channel region A2.

The second conductive pattern BML2 may be disposed below the second channel region A2 of the second transistor T2. The second conductive pattern BML2 may have a function of a blocking pattern. The second conductive pattern BML2 may be spaced apart from the second channel region A2 with the buffer layer BFL interposed therebetween in a thickness direction. The second conductive pattern BML2 may block light incident toward the second semiconductor pattern SP2 from the outside. Thus, the second conductive pattern BML2 may prevent external light from changing voltage-current properties of the second transistor T2.

The second conductive pattern BML2 overlapping the second channel region A2 may correspond to the second lower gate G2-2 (refer to FIG. 2). The second gate electrode GE2 overlapping the second channel region A2 may correspond to the second upper gate G2-1 (refer to FIG. 2).

The second conductive pattern BML2 is disposed on the base layer BS, and the buffer layer BFL may cover the second conductive pattern BML2. The second conductive pattern BML2 and the first conductive pattern BML1 may be disposed in the same layer and may be simultaneously formed through the same process operation.

The second transistor T2 may include a metal oxide pattern OS disposed below the second semiconductor pattern SP2. The metal oxide pattern OS may be disposed on the buffer layer BFL, and the first insulation layer 10 may cover the metal oxide pattern OS. That is, the metal oxide pattern OS and the first semiconductor pattern SP1 may be disposed in the same layer and may be simultaneously formed through the same process operation. The metal oxide pattern OS and the first semiconductor pattern SP1 may include the same material.

The metal oxide pattern OS may not overlap the second channel region A2 and overlap only the second source region S2 and the second drain region D2. In an embodiment, the metal oxide pattern OS may include a first pattern portion PT1 overlapping the second source region S2 and a second pattern portion PT2 overlapping the second drain region D2. The first pattern portion PT1 and the second pattern portion PT2 may be spaced apart in a plan view with the first insulation layer 10 interposed therebetween. Accordingly, the metal oxide pattern OS may perform a function of preventing by-products such as oxygen gas generated in the buffer layer BFL from entering the second source region S2 and the second drain region D2. Specifically, when a relatively high oxygen partial pressure condition is desired during the process of depositing a metal oxide when forming the first semiconductor pattern SP1, oxygen gas may be introduced into the buffer layer BFL, and the metal oxide pattern OS of the invention may prevent oxidation damage to be applied to the second source region S2 and the second drain region D2 due to the oxygen gas introduced into the buffer layer BFL. Accordingly, oxidation of the second source region S2 and the second drain region D2 is prevented, thereby improving the function of the second semiconductor pattern SP2 of the invention. However, unlike what is illustrated in FIG. 3A, when it is desired to prevent the introduction of oxygen gas or the like into the second channel region A2 as well as the second source region S2 and the second drain region D2, the metal oxide pattern OS may be disposed to overlap the second channel region A2.

A third insulation layer 30 may be disposed on the second insulation layer 20. The third insulation layer 30 may be disposed on the second semiconductor pattern SP2 to overlap the second source region S2, the second drain region D2, and the second channel region A2. The third insulation layer 30 may contact a side surface SS2 of the second semiconductor pattern SP2. That is, the third insulation layer 30 may include or consist of an integral film covering the second semiconductor pattern SP2. The third insulation layer 30 may be extended along the first direction DR1, and may overlap the first transistor T1 in a plan view. The third insulation layer 30 may be extended along the first direction DR1, and may entirely overlap the second insulation layer 20 in a plan view. The third insulation layer 30 may be provided as a common layer on the second insulation layer 20. In the disclosure, the third insulation layer 30 may mean a "gate insulation portion."

The third insulation layer 30 may include a first insulation portion P1 disposed on the second insulation layer 20 and a second insulation portion P2 disposed on the second semiconductor pattern SP2. The first insulation portion P1 may be disposed on the second insulation layer 20, and the second insulation portion P2 may be disposed on the second semiconductor pattern SP2 to overlap the second source region S2, the second drain region D2, and the second channel region A2. The second insulation portion P2 may contact an upper surface of the second semiconductor pattern SP2.

The third insulation layer 30 may include at least one inorganic layer. In an embodiment, the third insulation layer 30 may include at least one of aluminum oxide, titanium oxide, silicon oxide, silicon nitride, silicon oxynitride, zirconium oxide, or hafnium oxide, for example. However, the material of the third insulation layer 30 is not limited thereto.

The second gate electrode GE2 may be disposed on the second semiconductor pattern SP2. The second gate electrode GE2 may be disposed in an upper portion of the second channel region A2, and may overlap the second channel region A2. The third insulation layer 30 may be disposed between the second gate electrode GE2 and the second channel region A2. That is, the second gate electrode GE2 may be spaced apart from the second channel region A2 with the third insulation layer 30 interposed therebetween in a thickness direction. The second gate electrode GE2 may define the second channel region A2 of the second transistor T2. That is, the length of the second channel region A2 of the second transistor T2 may substantially be determined to correspond to the length of the second gate electrode GE2.

A fourth insulation layer 40 may be disposed on the third insulation layer 30 while covering the second gate electrode GE2. The fourth insulation layer 40 may include at least one inorganic layer. In an embodiment, the fourth insulation layer may include at least one of aluminum oxide, titanium oxide, silicon oxide, silicon nitride, silicon oxynitride, zirconium oxide, or hafnium oxide, for example. However, the material of the fourth insulation layer 40 is not limited thereto. In the disclosure, the fourth insulation layer 40 may mean an "upper insulation portion."

The hydrogen content of the third insulation layer 30 may be lower than the hydrogen content of the fourth insulation layer 40. In an embodiment of the invention, since the hydrogen content of the third insulation layer 30 is lower than the hydrogen content of the fourth insulation layer 40, and the third insulation layer 30 contacts a side surface of the second semiconductor pattern SP2, the function of the switching transistor of the second transistor T2 may be improved. When the third insulation layer 30 having a relatively low hydrogen content contacts the side surface of the second semiconductor pattern SP2, compared to a case in which the fourth insulation layer 40 having a relatively high hydrogen content compared to the third insulation layer 30 contacts the side surface of the second semiconductor pattern SP2, the amount of hydrogen introduced into the second channel region A2 may be reduced. Accordingly, since the length of the second semiconductor pattern SP2 in the first direction DR1 may be designed to be short for high-speed driving, a high-resolution effect of the display panel DP in an embodiment of the inventive concept may be implemented. In addition, electrical shorts may be prevented even when hydrogen gas is inevitably introduced in a process when manufacturing the display panel DP in an embodiment of the disclosure, and sensitivity to hydrogen gas may be lowered in the process when manufacturing the display panel DP according to the invention.

Referring to FIG. 2, FIG. 3B, and FIG. 3C, the circuit element layer DP-CL may include the storage capacitor $C_{ST}$ and the hold capacitor $C_{HOLD}$. The circuit element layer DP-CL may include a first capacitor electrode E1, a second capacitor electrode E2, and a third capacitor electrode E3. The first capacitor electrode E1 may be disposed on the base layer BS and may be disposed in the same layer as the layer on which the first conductive pattern BML1 is disposed. The second capacitor electrode E2 may be disposed on the buffer layer BFL and may be disposed in the same layer as the layer on which the first semiconductor pattern SP1 or the metal oxide pattern OS is disposed. The third capacitor electrode E3 may be disposed on the first insulation layer 10 and may be disposed in the same layer as the layer on which the first gate electrode GE1 is disposed.

The first and second storage electrodes E1-1 and E1-2 of the storage capacitor $C_{ST}$ may correspond to the first and second capacitor electrodes E1 and E2. The first and second hold electrodes E2-1 and E2-2 of the hold capacitor $C_{HOLD}$ may correspond to the second and third capacitor electrodes E2 and E3. The buffer layer BFL may be disposed between the first storage electrode E1-1 and the second storage electrode E1-2 of the storage capacitor $C_{ST}$, and the first insulation layer 10 may be disposed between the first hold electrode E2-1 and the second hold electrode E2-2 of the hold capacitor $C_{HOLD}$. Compared to a case in which a thick insulation layer such as the fourth insulation layer 40 is disposed in the storage capacitor $C_{ST}$ and the hold capacitor $C_{HOLD}$, the buffer layer BFL or the first insulation layer 10 is disposed in the storage capacitor $C_{ST}$ and the hold capacitor $C_{HOLD}$ in the invention, so that it is advantageous in securing the capacitance of the capacitors $C_{ST}$ and $C_{HOLD}$, and as a result, the area of the first capacitor electrode E1, the second capacitor electrode E2, and the third capacitor electrode E3 are relatively reduced, thereby implementing a high-resolution effect. However, the capacitors $C_{ST}$ and $C_{HOLD}$ of the invention are not limited to the above-described structure, and electrodes or the like of the capacitors $C_{ST}$ and $C_{HOLD}$ may be disposed at various positions when desired.

Referring to FIG. 3B, a display panel DP-1 of another embodiment may include a first insulation layer 10-1 disposed on a buffer layer BFL. The first insulation layer 10-1 may be disposed on the first semiconductor pattern SP1 to overlap in the first source region S1, the first drain region D1, and the first channel region A1. The first insulation layer 10-1 may contact a side surface SS1 of the first semiconductor pattern SP1. That is, the first insulation layer 10-1 may include or consist of an integral film covering the first semiconductor pattern SP1.

The display panel DP-1 of an embodiment may include a second insulation layer 20-1 disposed on the first insulation layer 10-1. The second insulation layer 20-1 may be disposed on the first insulation layer 10-1 to cover the first gate electrode GE1.

Referring to FIG. 3C, a display panel DP-2 of another embodiment of the invention may include a first insulation layer 10-2 at least a portion of which is disposed between the second capacitor electrode E2 and the third capacitor electrode E3. The first insulation layer 10-2 may be disposed on the first semiconductor pattern SP1 to overlap the first channel region A1, and may cover the second capacitor electrode E2. The first insulation layer 10-2 may be formed by being patterned after being formed through a process of forming one insulation layer.

In the display panel DP-2 of an embodiment, a second conductive pattern BML2 may be disposed on the first insulation layer 10-2, and the second insulation layer 20-2 may cover the second conductive pattern BML2. The second conductive pattern BML2 and the first gate electrode GE1 may be simultaneously formed through the same process operation. In an alternative embodiment, although not illustrated, the second conductive pattern BML2 may be disposed on the buffer layer BFL when desired.

The circuit element layer DP-CL may include connection electrodes CNE1-1, CNE1-2, CNE2-1, and CNE2-2. The connection electrodes CNE1-1, CNE1-2, CNE2-1, and CNE2-2 may be disposed on the second insulation layer 20. FIG. 3A to FIG. 3C illustrates the connection electrodes CNE1-1, CNE1-2, CNE2-1, and CNE2-2 disposed in the same layer as each other, but the embodiment of the inventive concept is not limited thereto, and some of the connection electrodes CNE1-1, CNE1-2, CNE2-1, and CNE2-2 may be disposed in different layers. In an embodiment, the circuit element layer DP-CL may further include an additional insulation layer disposed between the second insulation layer 20 and the third insulation layer 30, and some of the connection electrodes CNE1-1, CNE1-2, CNE2-1, and CNE2-2 may be disposed on the additional insulation layer, for example.

The connection electrodes CNE1-1, CNE1-2, CNE2-1, and CNE2-2 may include first connection electrodes CNE1-1 and CNE1-2, and second connection electrodes CNE2-1 and CNE2-2.

One first connection electrode CNE1-1 of the first connection electrodes CNE1-1 and CNE1-2 may be connected to the first source region S1 through a contact-hole passing through the second insulation layer 20. One first connection electrode CNE1-1 of the first connection electrodes CNE1-1 and CNE1-2 may be connected to the first source region S1 and the first conductive pattern BML1. The other first connection electrode CNE1-2 of the first connection electrodes CNE1-1 and CNE1-2 may be connected to the first drain region D1 through a contact-hole passing through the second insulation layer 20.

One second connection electrode CNE2-1 of the second connection electrodes CNE2-1 and CNE2-2 may be connected to the second source region S2 through a contact-hole passing through the second insulation layer 20. The other second connection electrode CNE2-2 of the second connection electrodes CNE2-1 and CNE2-2 may be connected to the second drain region D2 through a contact-hole passing through the second insulation layer 20.

A fifth insulation layer 50 may be disposed on the fourth insulation layer 40 while covering the connection electrodes CNE1-1, CNE1-2, CNE2-1, and CNE2-2. Each of the fourth insulation layer 40 and the fifth insulation layer 50 may include at least one of an inorganic layer and an organic layer, and may have a single-layered or multi-layered structure. The fifth insulation layer 50 may include an organic layer disposed in an upper portion. Since the fifth insulation layer 50 includes an organic layer, a flat upper surface may be provided while covering curved upper surfaces of components disposed in a lower portion of the third insulation layer 30.

The display element layer DP-OL may be disposed on the circuit element layer DP-CL. The display element layer DP-OL may include a light-emitting element OLED, and a pixel definition film PDL. The light-emitting element OLED may include a first electrode AE, a second electrode CE, a hole control layer HCL, an electron control layer ECL, and a light-emitting layer EML. In an embodiment, the first electrode AE of the light-emitting element OLED may be an anode, and the second electrode CE thereof may be a cathode.

The first electrode AE and the pixel definition film PDL of the light-emitting element OLED may be disposed on the fifth insulation layer 50. The first electrode AE may be connected to the first connection electrode CNE1-1 through a contact-hole passing through at least the fifth insulation layer 50, and may be electrically connected to the first source region S1 or the third capacitor electrode E3 through the first connection electrode CNE1-1.

Although not illustrated, a light-emitting opening which exposes at least a portion of the first electrode AE may be defined on the pixel definition film PDL. In the illustrated embodiment, the portion of the first electrode AE exposed by the light-emitting opening may correspond to a light-emitting region.

The pixel definition film PDL may include a polymer resin, and may further include an inorganic matter included in the polymer resin. The pixel definition film PDL of an embodiment may have a predetermined color. In an embodiment, the pixel definition film PDL may include a base resin, and a black pigment and/or a black dye mixed with the base resin, for example. However, the embodiment of the pixel definition film PDL is not limited thereto.

The hole control layer HCL may be disposed on the first electrode AE and the pixel definition film PDL. The hole control layer HCL may be commonly disposed in the pixels PX (refer to FIG. 1). The hole control layer HCL may include at least one of a hole injection layer, a hole transport layer, or an electron blocking layer.

The light-emitting layer EML may be disposed on the hole control layer HCL. The light-emitting layer EML may include an organic material and/or an inorganic material. The light-emitting layer EML may be disposed as a pattern in a region corresponding to the light-emitting opening PX-OP. The light-emitting layer EML may generate light of any one of red, green, and blue colors. However, without being not limited thereto, the light-emitting layer EML may be commonly disposed in the pixels PX (refer to FIG. 1) and may generate blue light or white light.

The electron control layer ECL may be disposed on the light-emitting layer EML and the hole control layer HCL. The electron control layer ECL may be commonly disposed in the pixels PX (refer to FIG. 1). The electron control layer ECL may include at least one of an electron injection layer, an electron transport layer, or a hole blocking layer.

The second electrode CE may be disposed on the electron control layer ECL. The second electrode CE may be commonly disposed in the pixels PX (refer to FIG. 1).

The first power voltage ELVSS (refer to FIG. 2) may be applied to the second electrode CE, and the second power voltage ELVDD (refer to FIG. 2) may be applied to the first electrode AE. A hole and an electron injected into the light-emitting layer EML are combined to form an exciton, and when the exciton transits to a ground state, the light-emitting element OLED may emit light.

The encapsulation layer TFE may be disposed on the display element layer DP-OL and seal light-emitting element OLED. The encapsulation layer TFE may include a plurality of thin films. In an embodiment, the encapsulation layer TFE may include inorganic films and an organic film disposed between the inorganic films, for example. The thin films of the encapsulation layer TFE may be disposed to improve the optical efficiency of the light-emitting element OLED, or to protect the light-emitting element OLED. An inorganic film may protect the light-emitting element OLED from moisture and/or oxygen, and an organic film may protect the light-emitting element OLED from foreign substances such as dust particles.

Figure 4:
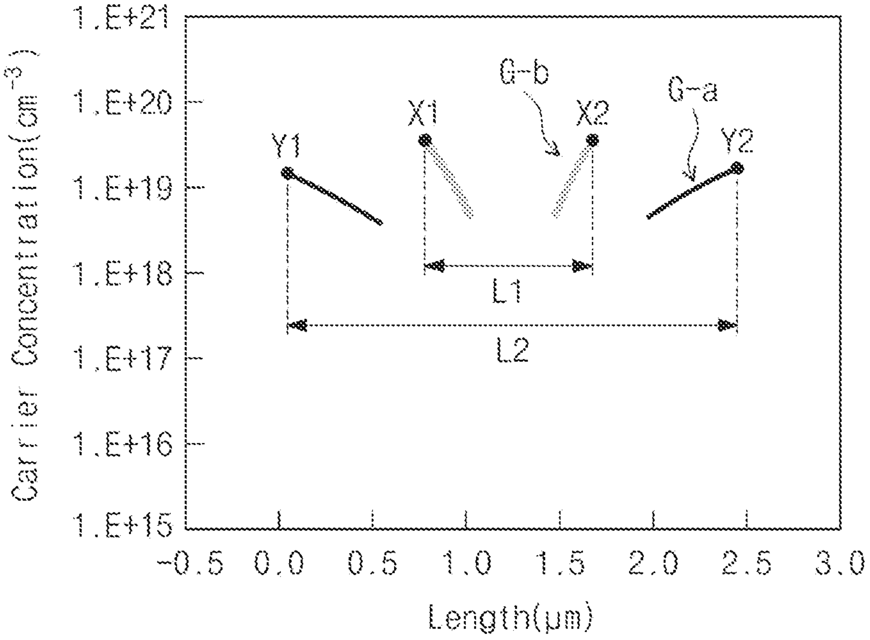
FIG. 4 is a graph comparing properties between an embodiment of a transistor according to the inventive concept and a comparative embodiment of a transistor according to the inventive concept.

FIG. 4 is a graph comparing properties between an embodiment of a transistor according to the inventive concept and a comparative embodiment of a transistor according to the inventive concept.

The transistor in an embodiment may mean the second transistor T2 illustrated in FIG. 3A and FIG. 3B. That is, as illustrated in FIG. 3A and FIG. 3B, the transistor of an embodiment illustrated in FIG. 4 may be a transistor having a structure in which one third insulation layer 30 is disposed between the second gate electrode GE2 and the second semiconductor pattern SP2 to cover the second semiconductor pattern SP2, and the one third insulation layer 30 contacts a side surface of the second semiconductor pattern SP2. Unlike what is illustrated in FIG. 3A and FIG. 3B, the transistor according to a comparative embodiment may be a transistor having a structure in which one third insulation layer 30 does not contact the side surface of the second semiconductor pattern SP2, and the one third insulation layer 30 is etched to overlap only the second channel region A2. That is, the transistor according to a comparative embodiment may have a structure in which one third insulation layer 30 is disposed on the second semiconductor pattern SP2 to overlap only the second channel region A2.

In FIG. 4, a first graph G-a shows the concentration of charge carriers according to the horizontal length of a semiconductor pattern of an embodiment of the invention, and a second graph G-b shows the concentration of charge carriers according to the horizontal length of a semiconductor pattern of a comparative embodiment.

Referring to FIG. 4, an effective channel length L2 of the transistor in an embodiment of the disclosure may be defined as a horizontal distance between a first position Y1 and a second position Y2, and an effective channel length L1 of the transistor according to a comparative embodiment may be defined as a horizontal distance between a third position X1 and a fourth position X2. Referring to the first graph G-a, in the case of the transistor in an embodiment of the disclosure, a region from opposite ends to the first position Y1 of the first graph G-a and the second position Y2 of the first graph G-a based on an x-axis (horizontal axis) of the graph corresponds to a region of a reduced metal in view of the fact that the concentration of charge carriers has a predetermined value. That is, in the case of the transistor in an embodiment of the disclosure, it may be understood that hydrogen has been introduced to the first position Y1 of the first graph G-a and the second position Y2 of the first graph G-a. Referring to the second graph G-b, in the case of the transistor according to a comparative embodiment, a region from opposite ends to the third position X1 of the second graph G-b and the fourth position X2 of the second graph G-b based on the x-axis (horizontal axis) of the graph corresponds to a region of a reduced metal in view of the fact that the concentration of charge carriers has a predetermined value. That is, in the case of the transistor according to a comparative embodiment, it may be understood that hydrogen has been introduced to the third position X1 of the second graph G-a and the fourth position X2 of the second graph G-b. Therefore, it may be seen that the effective channel length L2 of the transistor in an embodiment of the disclosure is greater than the effective channel length L1 of the transistor according to a comparative embodiment. The transistor in an embodiment of the disclosure includes the insulation layer 30 (refer to FIG. 3A) in contact with the side surface SS2 (refer to FIG. 3A) of the second semiconductor pattern SP2 (refer to FIG. 3A), and the amount of hydrogen contained in the insulation layer 30 (refer to FIG. 3A) is small, so that the amount of hydrogen gas introduced into the second channel region A2 (refer to FIG. 3A) may be small.

In the case of a switching transistor, a short-length semiconductor pattern is desired to implement the effect of high-speed driving, and the transistor in an embodiment of the disclosure secures a sufficient effective channel length even when including a short-length semiconductor pattern, and thus may implement the effect of high-speed driving. Accordingly, the display panel of an embodiment according to the invention may implement a relatively high resolution. In addition, when the effective channel length of a transistor is short, a semiconductor pattern does not perform the function of a semiconductor and is electrically shorted, but the transistor in an embodiment of the disclosure has a sufficient effective channel length, so that even when hydrogen is introduced when manufacturing the display panel of the invention, sensitivity is low, which may be effective in preventing a short circuit.

Hereinafter, a method for manufacturing a display panel in an embodiment will be described with reference to the drawings. In the description of the method for manufacturing the display panel of an embodiment, descriptions of the same contents as those of the display panel described above will be omitted.

FIG. 5A to FIG. 5E are cross-sectional views of an embodiment of some operations of a method for manufacturing a display panel according to the inventive concept.

Figure 5A:
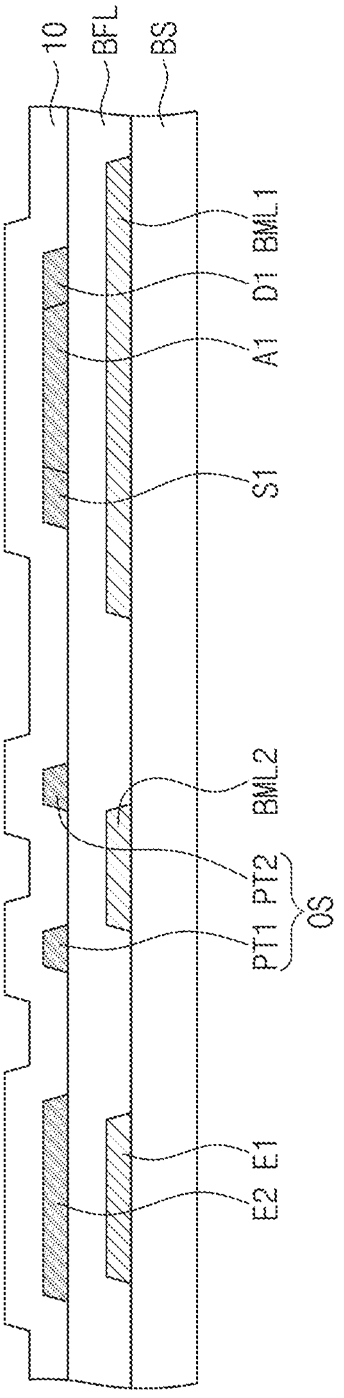
FIG. 5A to FIG. 5E are cross-sectional views of an embodiment of some operations of a method for manufacturing a display panel according to the inventive concept.

Referring to FIG. 5A, the method for manufacturing a display panel in an embodiment of the disclosure may include depositing a first conductive pattern BML1, a second conductive pattern BML2, and a first capacitor electrode E1 on a base layer BS. The first conductive pattern BML1, the second conductive pattern BML2, and the first capacitor electrode E1 may be simultaneously formed through the same process operation. Thereafter, the method may include depositing a buffer layer BFL covering the first conductive pattern BML1, the second conductive pattern BML2, and the first capacitor electrode E1. After forming the buffer layer BFL, the manufacturing method of an embodiment may include depositing a material including a metal oxide on the buffer layer BFL. The above operation may be an operation of depositing a first semiconductor pattern SP1, a second capacitor electrode E2, and a metal oxide pattern OS on the buffer layer BFL. The first semiconductor pattern SP1, the second capacitor electrode E2, and the metal oxide pattern OS may be simultaneously formed through the same process operation using the same material. The forming of the first semiconductor pattern SP1, the second capacitor electrode E2, and the metal oxide pattern OS may be performed by a deposition process through a mask, so that each of the first semiconductor pattern SP1, the second capacitor electrode E2, and the metal oxide pattern OS may be formed to be spaced apart in a plan view. The metal oxide pattern OS may be formed to overlap a second source region S2 (refer to FIG. 5C) and a second drain region D2 (refer to FIG. 5C) of a second semiconductor pattern SP2 (refer to FIG. 5C) to be described later. The manufacturing method of an embodiment may include, after the forming of the first semiconductor pattern SP1, depositing a first insulation layer 10. The first insulation layer 10 may cover the first semiconductor pattern SP1, the second capacitor electrode E2, and the metal oxide pattern OS. However, although not illustrated, a manufacturing method of another embodiment may include, after the depositing of the first insulation layer 10, etching the first insulation layer 10 so as to overlap only the first channel region A1.

Figure 5B:
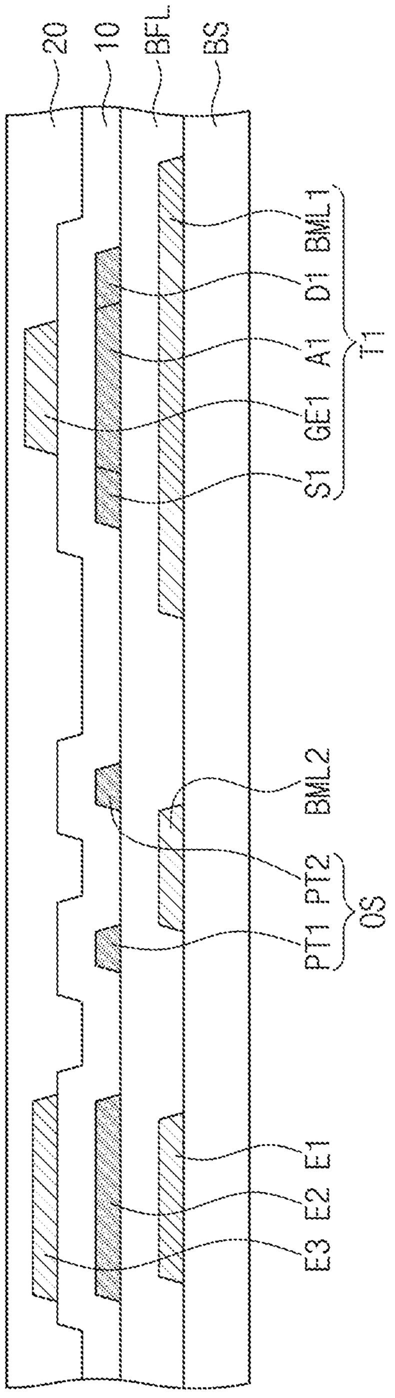

Referring to FIG. 5B, the method for manufacturing a display panel in an embodiment of the disclosure may include forming a first gate electrode GE1 on the first insulation layer 10, thereby forming a first transistor T1. At this time, the above operation may include forming a third capacitor electrode E3 on the first insulation layer 10. The first gate electrode GE1 and the third capacitor electrode E3 may be simultaneously formed through the same process operation. In addition, although not illustrated, the second conductive pattern BML2 may be formed in the same operation of forming the first gate electrode GE1 on the first insulation layer 10. The second conductive pattern BML2 and the first insulation layer 10 may be formed in the same layer. The manufacturing method of an embodiment may include, after the forming of the first transistor T1, forming a second insulation layer 20 on the first insulation layer 10. In an embodiment, the first source region S1 and the first drain region D1 may be reduced by the second insulation layer 20.

Figure 5C:
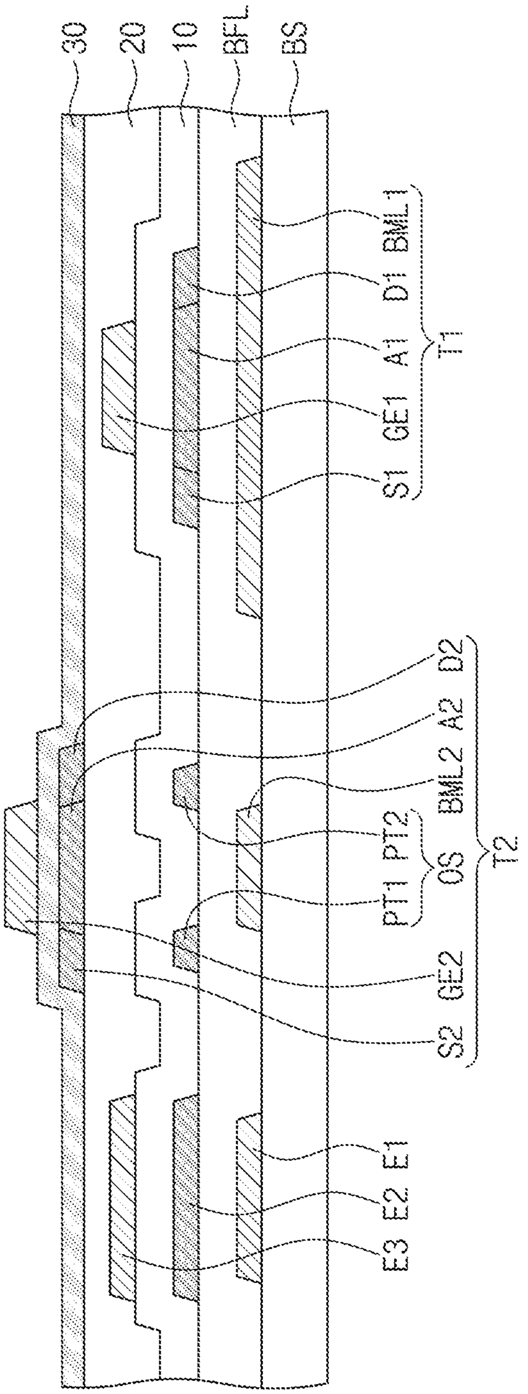

Referring to FIG. 5C, the method for manufacturing a display panel in an embodiment of the disclosure may include depositing a material including a metal oxide on the second insulation layer 20. The above operation may be an operation of forming the second semiconductor pattern SP2 on the second insulation layer 20. The second semiconductor pattern SP2 may be formed to be spaced apart from the first semiconductor pattern SP1 in a plan view. After the forming of the second semiconductor pattern SP2, the method for manufacturing a display panel in an embodiment may include forming a third insulation layer 30. The third insulation layer 30 may cover the second semiconductor pattern SP2. The third insulation layer may be formed to overlap a second source region S2, a second drain region D2, and a second channel region A2 and the second semiconductor pattern SP2. The third insulation layer 30 may be formed to overlap the first semiconductor pattern SP1. The third insulation layer 30 may be formed as a common layer on the second insulation layer 20. After the forming of the third insulation layer 30, an operation of forming a second gate electrode GE2 on the third insulation layer 30 may be included. The second gate electrode GE2 may be formed to overlap the second channel region A2.

Figure 5D:
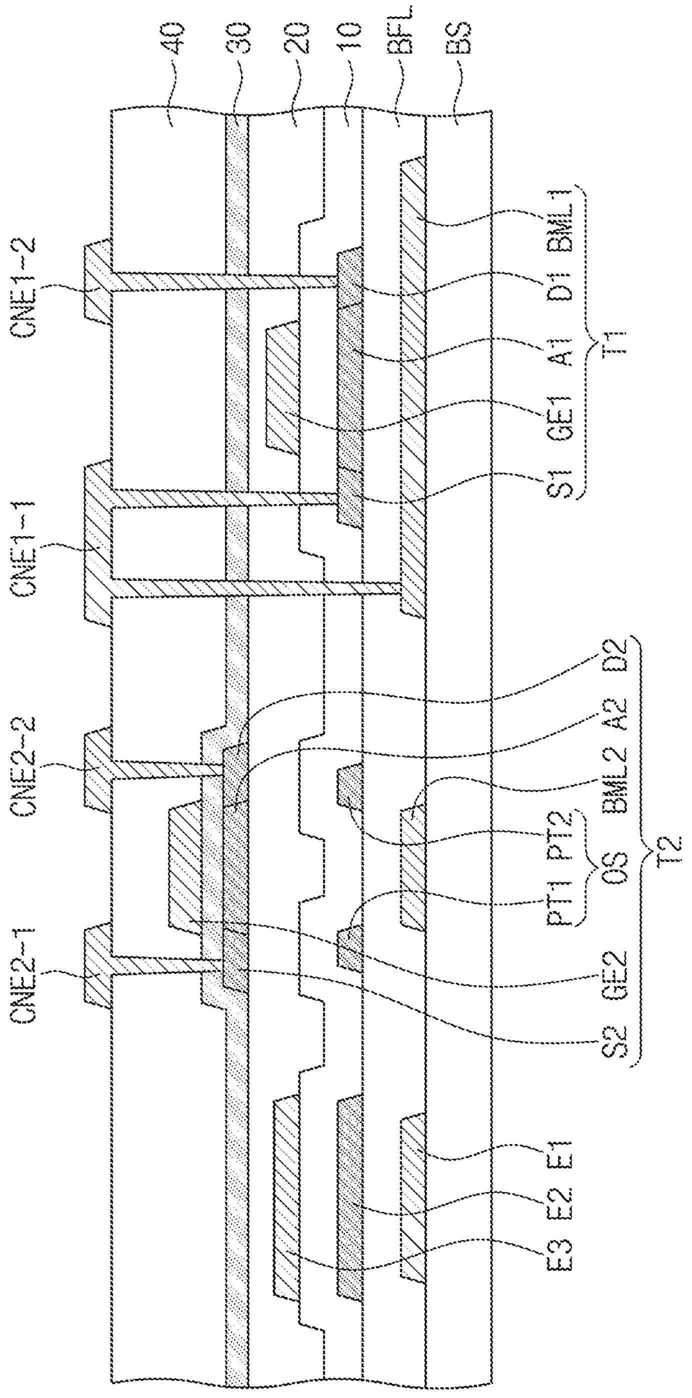

Referring to FIG. 5D, the method for manufacturing a display panel in an embodiment of the disclosure may include forming a fourth insulation layer 40 which covers the second gate electrode GE2. An operation of depositing the fourth insulation layer 40 may be performed in a state in which the hydrogen partial pressure is relatively low compared to the operation of depositing the third insulation layer 30. Accordingly, the hydrogen content of the fourth insulation layer 40 may be lower than the hydrogen content of the third insulation layer 30. In an embodiment, the second source region S2 and the second drain region D2 may be reduced by the fourth insulation layer 40. After the forming of the fourth insulation layer 40, the manufacturing method of an embodiment may include an operation of forming connection electrodes CNE1-1, CNE1-2, CNE2-1, and CNE2-2 on the fourth insulation layer 40.

Figure 5E:
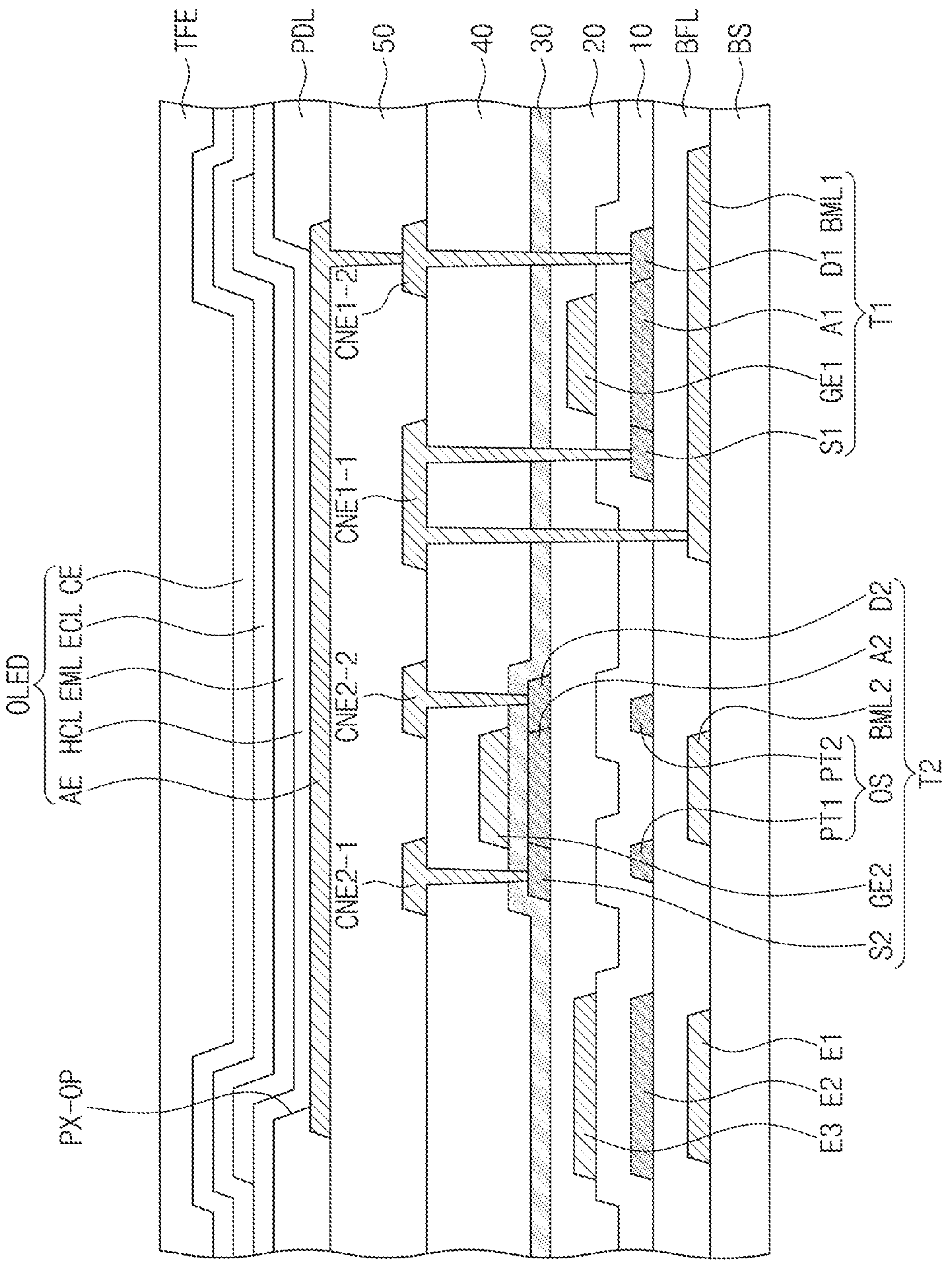

Referring to FIG. 5E, the method for manufacturing a display panel in an embodiment of the disclosure may include forming a fifth insulation layer 50 on the fourth insulation layer 40. The fifth insulation layer 50 may include at least one organic layer. The fifth insulation layer 50 may be formed to cover the connection electrodes CNE1-1, CNE1-2, CNE2-1, and CNE2-2, or the like. The manufacturing method of an embodiment may include, after the forming of the fifth insulation layer 50, forming a light-emitting element OLED, a pixel definition film PDL, and an encapsulation layer TFE.

Transistors in an embodiment of the disclosure include a metal oxide, and thus may have relatively high electron mobility and reduced leak current.

A transistor in an embodiment of the disclosure includes an insulation layer disposed on a side surface of a semiconductor pattern, and thus may prevent reduction of a channel region. Accordingly, it is possible to prevent short circuits of the transistor, and the length of the channel region and an effective channel length may be kept substantially the same.

Although the invention has been described with reference to preferred embodiments of the invention, it will be understood by those skilled in the art that various modifications and changes in form and details may be made therein without departing from the spirit and scope of the invention as set forth in the following claims.

Accordingly, the technical scope of the inventive concept is not intended to be limited to the contents set forth in the detailed description of the specification, but is intended to be defined by the appended claims.

What is claimed is:

1. A display panel comprising:

a light-emitting element; and a pixel circuit electrically connected to the light-emitting element, the pixel circuit including:

a first transistor including a first semiconductor pattern including a first source region, a first drain region, and a first channel region disposed between the first source region and the first drain region, and a first gate electrode disposed on the first semiconductor pattern and overlapping the first channel region;

a first insulation layer disposed between the first semiconductor pattern and the first gate electrode and overlapping the first channel region;

a second insulation layer disposed on the first gate electrode and covering the first transistor;

a second transistor disposed on the second insulation layer and including a second semiconductor pattern including a second source region, a second drain region, and a second channel region disposed between the second source region and the second drain region, and a second gate electrode disposed on the second semiconductor pattern and overlapping the second channel region; and a third insulation layer disposed between the second semiconductor pattern and the second gate electrode and overlapping the first transistor in a plan view, wherein the first semiconductor pattern and the second semiconductor pattern each include a metal oxide semiconductor material, the pixel circuit further comprises a fourth insulation layer disposed on the second gate electrode and covering the second transistor, and a hydrogen content of the fourth insulation layer is higher than a hydrogen content of the third insulation layer.

2. The display panel of claim 1, wherein a charge carrier in the first semiconductor pattern has a first mobility and a charge carrier in the second semiconductor pattern has a second mobility, wherein the first mobility is lower than the second mobility.

3. The display panel of claim 1, wherein the first transistor and the second transistor are spaced apart along a first direction, and the third insulation layer is extended in the first direction.

4. The display panel of claim 1, wherein the third insulation layer overlaps each of the second source region, the second drain region, and the second channel region.

5. The display panel of claim 1, wherein the third insulation layer comprises:

a first insulation portion disposed on the second insulation layer; and a second insulation portion disposed on the second semiconductor pattern.

6. The display panel of claim 5, wherein the third insulation layer contacts a side surface of the second semiconductor pattern.

7. The display panel of claim 1, wherein:

the first transistor is a driving transistor; and the second transistor is a switching transistor.

8. The display panel of claim 1, wherein:

the first insulation layer overlaps each of the first channel region, the first source region, and the first drain region; and the first gate electrode overlaps the first channel region.

9. The display panel of claim 1, wherein the first transistor further comprises a first conductive pattern disposed below the first semiconductor pattern, wherein the pixel circuit further comprises a buffer layer disposed on the first conductive pattern.

10. The display panel of claim 1, wherein the pixel circuit further comprises a first capacitor including a first hold electrode and a second hold electrode, wherein:

the second hold electrode is disposed in a same layer as a layer on which the first semiconductor pattern is disposed; and the first hold electrode is disposed in a same layer as a layer on which the first gate electrode is disposed.

11. The display panel of claim 10, wherein the first insulation layer is disposed between the first hold electrode and the second hold electrode.

12. The display panel of claim 9, wherein the pixel circuit further comprises a second capacitor including a first storage electrode and a second storage electrode, wherein:

the first storage electrode is disposed in a same layer as a layer on which the first conductive pattern is disposed; and the second storage electrode is disposed in a same layer as a layer on which the first semiconductor pattern is disposed.

13. The display panel of claim 12, wherein the buffer layer is disposed between the first storage electrode and the second storage electrode.

14. The display panel of claim 1, wherein the second transistor further comprises a metal oxide pattern disposed below the second semiconductor pattern, wherein the metal oxide pattern includes a first pattern portion overlapping the second source region and a second pattern portion overlapping the second drain region.

15. The display panel of claim 14, wherein the metal oxide pattern does not overlap the second channel region.

16. The display panel of claim 14, wherein:

the first pattern portion and the second pattern portion are spaced apart in the plan view; and the first insulation layer is disposed between the first pattern portion and the second pattern portion.

17. The display panel of claim 14, wherein:

the metal oxide pattern is disposed in a same layer as a layer on which the first semiconductor pattern is disposed, and a material included in the metal oxide pattern is identical to a material included in the first semiconductor pattern.

18. A display panel comprising:

a light-emitting element; and a pixel circuit electrically connected to the light-emitting element, the pixel circuit including:

a metal oxide transistor including a metal oxide semiconductor pattern including a source region, a drain region, and a channel region disposed between the source region and the drain region, and a gate electrode disposed on the metal oxide semiconductor pattern and overlapping the channel region;

a gate insulation portion disposed between the metal oxide semiconductor pattern and the gate electrode and overlapping the source region, the drain region, and the channel region, and in contact with a side surface of the metal oxide semiconductor pattern;

a metal oxide pattern disposed below the metal oxide semiconductor pattern, and including a first pattern portion overlapping the source region and a second pattern portion overlapping the drain region; and an upper insulation portion disposed on the gate insulation portion and the gate electrode, wherein a hydrogen content of the gate insulation portion is lower than a hydrogen content of the upper insulation portion.

* * * * *